United States Patent [19]

de Waard

[11] 4,429,396

[45] Jan. 31, 1984

[54] SEMICONDUCTOR LASER HAVING A DOPED SURFACE ZONE

[75] Inventor: Peter J. de Waard, Eindhoven, Netherlands

[73] Assignee: U.S. Philips Corporation, New York, N.Y.

[21] Appl. No.: 272,438

[22] Filed: Jun. 10, 1981

[30] Foreign Application Priority Data

Jun. 27, 1980 [NL] Netherlands ............... 8003728

[51] Int. Cl.³ ............................................. H01S 3/19
[52] U.S. Cl. ....................................... 372/45; 357/17; 372/46
[58] Field of Search ............. 372/44, 45, 46; 357/17

[56] References Cited

U.S. PATENT DOCUMENTS 4,122,410 10/1978 Kressel et al. .................. 372/46
4,190,809 2/1980 Goodman et al. ............... 372/46

Primary Examiner—James W. Davie
Attorney, Agent, or Firm—Thomas A. Briody; Robert T. Mayer; Steven R. Biren

[57] ABSTRACT

A semiconductor laser with a double hetero junction includes a strip-shaped semiconductor contact layer which is present on a passive layer of the same conductivity type, with a highly doped zone of the same conductivity type which extends over at least a part of the thickness of the contact layer and beside the contact layer in the passive layer so as to increase the radiation mode stability. According to the invention, the highly doped zone extends only over a part of the thickness of the passive layer in such a manner that below and beside the contact layer a difference in effective refractive index of at least 0.0005 and at most 0.005 is obtained.

9 Claims, 8 Drawing Figures

SEMICONDUCTOR LASER HAVING A DOPED SURFACE ZONE

BACKGROUND OF THE INVENTION

The invention relates to a semiconductor laser having a semiconductor body comprising a first passive semiconductor layer of a first conductivity type, an active semiconductor layer present thereon, a second passive semiconductor layer of the second opposite conductivity type present on the active layer, a strip-shaped semiconductor contact layer of the second conductivity type present on the second passive layer, and contact means to apply a voltage in the forward direction between the contact layer and the first passive layer so as to generate coherent electro-magnetic radiation in a strip-shaped part of the active layer underlying the contact layer within a resonator, the passive layers having a smaller refractive index for the generated radiation than the active layer, a doped surface zone of the second conductivity type being present which extends over at least a part of the thickness of the contact layer and beside the contact layer extends in the second passive layer and has a higher doping concentration than the second passive layer.

The invention furthermore relates to a method of manufacturing the semiconductor laser.

A semiconductor laser of the kind described is known from the article by Bouley et al., in IEEE Journal of Quantum Electronics, QE 15, 1979, pp. 767–771. This article describes a laser structure of the type having a double hetero junction, with an active layer of p-type gallium arsenide which is present between passive n-type and p-type layers of gallium aluminum arsenide on the last of which a strip-shaped contact layer of p-type gallium arsenide is provided. The active region in which the radiation is generated and propagated is restricted in the lateral direction, that is to say in a direction parallel to the surface and perpendicular to the longitudinal direction of the strip-shaped contact layer, by a step in the refractive index which is caused by a zinc diffusion which extends over a part of the thickness of the contact layer, and which beside the contact layer penetrates through the p-type gallium aluminum arsenide layer and through the active layer into the n-type gallium aluminum arsenide layer. Furthermore, the current of the active region is laterally restricted by an electrically substantially insulating region which is obtained by proton bombardment and which also extends into the n-type passive layer.

With the known semiconductor laser described above a good linearity of radiation intensity versus current intensity is obtained, while good transversal and longitudinal radiation mode stability is also obtained.

A disadvantage of this laser structure, however, is that the zinc diffusion should be carried out through the active layer. As a result of this, defects in the crystal structure can easily arise in the active layer, which defects may afterwards give rise to degradation and consequent oscillations and hence to a shortening of the laser lifetime.

Furthermore, inter alia as a result of the comparatively large step in the refractive index of the active layer in the lateral direction, which in the laser described is of the order of 0.01, it has been found that higher order transversal radiation modes can nevertheless occur rather easily in the case of small deviations in, for example, the geometry of the layer structure or the current density. Finally, the leakage current on either side of the strip-shaped contact layer via the diffusion is rather large, which necessitates current restriction by means of a proton bombardment in this known laser, which means an extra complication.

SUMMARY OF THE INVENTION

One of the objects of the invention is to remove or at least considerably mitigate the disadvantages associated with known semiconductor lasers. A particular object of the invention is to provide a semiconductor laser of the kind described which is less sensitive to degradation and to the occurrence of higher order transversal radiation modes, for the manufacture of which laser a proton bombardment is not required.

The invention is inter alia based on the recognition of the fact that the end in view can be reached by efficaciously choosing the location of the region of the doped zone relative to the active layer.

According to the invention, a semiconductor laser of the kind described above is characterized in that the doped surface zone extends beside the contact layer over only a part of the thickness of the second passive layer, the distance between the surface zone and the active layer being chosen to be such that the effective refractive index for generated electromagnetic radiation in the layer structure at the center of the contact layer is larger by an amount of at least 0.0005 and at most 0.005 than in the layer structure beside the contact layer at the area of the doped surface zone.

The effective refractive index for radiation of the frequency generated by the laser is to be understood to mean herein the light velocity in a vacuum divided by the phase velocity of the emitted wave in the active layer (which is assumed to be expanded infinitely in two dimensions.)

The effective refractive index for generated electromagnetic radiation in the layer structure in a given place is to be understood to mean herein the effective refractive index for an electro-magnetic wave of the emitted frequency when it propagates in a layer structure, the vertical construction of which is equal to that in the considered place and the expansion of which in all directions parallel to the active layer is assumed to be infinite.

It has been found that in the semiconductor layer according to the invention, as a result of the small step in the effective refractive index, the occurrence of higher order transversal radiation modes is impeded very considerably while due to the smaller electric conductivity on either side of the strip-shaped contact layer no proton bombardment or other form of current restriction is necessary.

The conditions for the effective refractive index are satisfied, for example, in a preferred embodiment according to which the thickness of the active layer is between on the one hand a minimum thickness of 0.05 $\mu$m with an associated maximum value of 0.5 $\mu$m for the distance beside the contact layer between the doped surface zone and the active layer and of an associated minimum value of $5 \cdot 10^{18}$ atoms per cm$^3$ for the average doping concentration of the surface zone, and on the other hand a maximum thickness of 0.2 $\mu$m for the active layer with an associated minimum value of 0.1 $\mu$m for the said distance and an associated maximum doping concentration of $5 \cdot 10^{19}$ atoms per cm$^3$ for the surface zone.

In accordance with the circumstances and the desired wavelength, different materials may be chosen for the various layers. According to an important preferred embodiment, the passive layers consist of gallium aluminum arsenide, while the contact layer consists of gallium aluminum arsenide having a lower aluminum content than the second passive layer, or of gallium arsenide. When the second passive layer, that is to say the passive layer on the side of the contact layer, is p-type conductive, the surface zone may advantageously be formed by doping with zinc. As a matter of fact, zinc diffuses more rapidly through gallium aluminum arsenide having a higher aluminum content so that the contact layer may advantageously be used as a mask for the zinc diffusion and the semiconductor laser can thus be manufactured in self-registration.

According to a further preferred embodiment, the doped surface zone on either side of the contact layer does not extend up to the edge of the crystal but according to two parallel strip-shaped zones adjoining the contact layer so that the leakage current is reduced.

The invention also relates to a particularly suitable method of manufacturing the semiconductur laser in which a first passive semiconductor layer of the first conductivity type, an active semiconductor layer having a smaller forbidden band gap than the first passive layer, a second passive semiconductor layer of the second conductivity type having a larger forbidden band gap than the active semiconductor laser and a semiconductor contact layer of a semiconductor material of the second conductivity type differing from the second passive layer are successively grown epitaxially on a semiconductor substrate of a first conductivity type, after which the contact layer is shaped in the form of a strip-shaped mesa by etching and a layer-shaped surface zone of the second conductivity type is formed by doping while using said strip-shaped mesa as a mask, which zone extends over at least a part of the thickness of the contact layer and over only a part of the juxtaposed parts of the second passive layer, after which electrode layers are provided on at least the contact layer and the substrate.

BRIEF DESCRIPTION OF THE DRAWING

The invention will now be described in greater detail with reference to several embodiments, in which.

Figure 1:
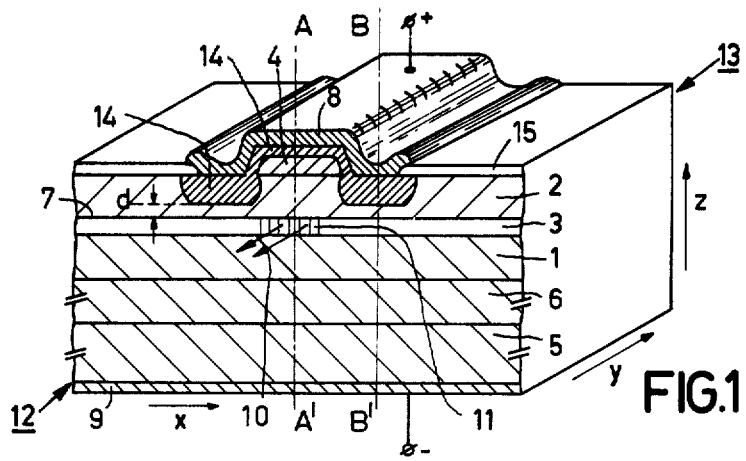
FIG. 1 is partly a cross-sectional view and partly a perspective view of a semiconductor laser according to the invention.

The Figures are diagrammatic and not drawn to scale, and in particular the dimensions in the direction of thickness are relatively exaggerated. Corresponding parts are generally referred to by the same reference numerals, and semiconductor regions of the same conductivity type are generally shaded in the same direction.

DESCRIPTION OF THE PREFERRED EMBODIMENTS

FIG. 1 is partly a cross-sectional view and partly a perspective view of a semiconductor laser according to the invention. The laser is constructed from a semiconductor body comprising a first passive semiconductor layer 1 of a first conductivity type, in this example an n-type conductive layer of gallium aluminum arsenide. Present thereon is an active semiconductor layer 3, in this example of (for example, n-type) gallium aluminum arsenide, and a second passive semiconductor layer 2 of the second, opposite, conductivity type, in this example a p-type layer 2, is present on the active layer 3. In the example shown the layer 2 also comprises gallium aluminum arsenide.

A strip-shaped semiconductor contact layer 4 of the second (here p) conductivity type, which contact layer consists in this case of galium aluminum arsenide having a considerably lower aluminum content than the layer 2, is present on the second passive layer 2. The above-described layer structure has been grown epitaxially on a supporting body which in this example consists of the substrate 5 of n-type gallium arsenide on which an epitaxial layer 6, also of n-type gallium arsenide, has been deposited so as to obtain a crystal surface which is as perfect as possible for the epitaxial growth.

In the layer structure described, a p-n junction 7 is present between the contact layer 4 and the first passive layer 1. When the active layer 3 is n-type conductive, as assumed in FIG. 1, said junction is present between the layers 2 and 3 and when the active layer 3 is p-type conductive, it is present between the layers 1 and 3. In order to convey a current in the forward direction through said p-n junction, contact means are present to apply a voltage in the forward direction between the contact layer 4 and the first passive layer 1. On the side of the contact layer 4 the contact means comprises an electrode layer 8 and on the side of the first passive layer 1 the means comprises the layer 6, the substrate 5, and an electrode layer 9 provided on the substrate 5. By applying voltage, coherent electromagnetic radiation 10 can be generated in a strip-shaped part 11 (shaded vertically) of the active layer 3 underlying the contact layer 4 within a resonator. In this example, as is usual, the resonator is formed by reflective cleavage faces (12, 13) of the crystal extending substantially perpendicularly to the strip-shaped contact layer.

In order to restrict the wave propagation to the active layer 3 as much as possible, the doping concentration of the passive layers 1 and 2, relative to the active layer 3, is chosen to be such that the layers 1 and 2 have a smaller refractive index for the generated radiation than the active layer 3.

Also present is a doped surface zone 14 of the second, in this case p-conductivity type, which surface zone 14 extends over at least a part of the thickness of the contact layer 4 and beside the contact layer extends in the second passive layer 2, and has a higher doping concentration than the second passive layer 2. This surface zone 14, as will be described in detail hereinafter, serves for laterally confining the radiation within the strip-shaped region 11 of the active layer 3.

According to the invention, the doped surface zone 14 extends beside the contact layer 4 over only a part of the thickness of the second passive layer 2. The distance d between the surface zone 14 and the active layer 3 (FIG. 1) is chosen to be such that the effective refractive index for generated electromagnetic radiation in the layer structure at the center of the contact layer 4 is larger by an amount of at least 0.0005 and at most 0.005 than in the layer structure beside the contact layer 4 at the area of the doped surface zone 14.

The effective refractive index in the layer structure below the center of the contact layer is to be understood to mean herein the effective refractive index in a layer structure the vertical construction of which corresponds to that on the line AA' (FIG. 1) but which would extend infinitely far in the x and y directions. The same applies to the refractive index in the layer structure beside the contact layer at the area of the surface zone 14, now taken along the line BB'.

In order to obtain the desired result, the following dimensions, compositions and dopings are used in the embodiment described:

Substrate 5: n-type GaAs, doped with $5.10^{17}$–$5.10^{18}$ donor atoms per $cm^3$, thickness 300 $\mu m$, layer 6: n-type GaAs, doped with $10^{18}$ tin atoms per $cm^3$, thickness 10–15 $\mu m$, layer 1: n-type $Ga_{0.67}Al_{0.33}As$, doped with $1$–$3.10^{17}$ tin atoms per $cm^3$, thickness 1–1.5 $\mu m$ layer 3: undoped (n-type) $Ga_{0.95}Al_{0.05}As$, thickness 0.05–0.15 $\mu m$ layer 2: p-type $Ga_{0.67}Al_{0.33}As$, doped with $1$–$3.10^{17}$ germanium atoms per $cm^3$, thickness 1.6 $\mu m$ layer 4: p-type $Ga_{0.95}Al_{0.05}As$ doped with $10^{18}$ germanium atoms per $cm^3$, thickness 1.7 $\mu m$.

The doped p-type surface zone 14 was obtained by a zinc diffusion and had an average doping concentration of approximately $2.10^{19}$ atoms per $cm^3$. The distance d (see FIG. 1) was approximately 0.3 $\mu m$. The above-mentioned effective refractive index difference below and beside the contact layer in the data of this example according to calculations was approximately 0.001.

This may be understood as follows. From H. C. Casey and M. B. Panish, "Heterostructure lasers", volume A, Academic Press 1978, p. 31 it follows for the refractive index variation as a result of free charge carriers an expression (2.3-2) which for p-type GaAs reads:

$$\Delta n/n = 1.27.10^{-22} p$$

wherein p is the free hole concentration in $cm^{-3}$. For $p = 2.10^{19}$ $cm^{-3}$ it follows from this (with n=3.6):

that $\Delta n = 2.54.10^{-3}$.

Figure 2:
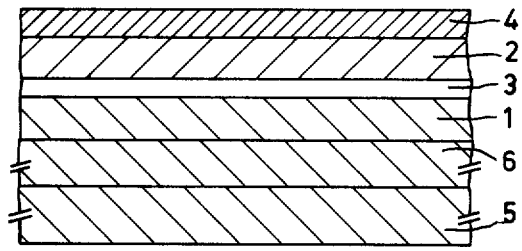
FIGS. 2 to 4 are diagrammatic cross-sectional views of successive stages of the manufacture of said semiconductor laser.

From page 55, FIG. 2.5-13 (a) of the same book follows a "confinement factor" $\Gamma$ of approximately 0.2 (for $\chi \approx 0.1$ and $d \approx 0.15$ $\mu m$). Since the fraction of the electric field in the diffused region is equal to $(1 - \Gamma/2) = 0.4$ it holds for the effective step in the refractive index approximately that $$\Delta n = 2.54 \times 10^{-3} \times 0.4 = 0.001.$$

The width of the strip-shaped contact layer 4 was approximately 4 $\mu m$, that of the strip-shaped zones on either side of the contact layer was approximately 2 $\mu m$.

The laser according to this embodiment showed only a small leakage current as a result of the small width and depth of penetration of the zone 14 on either side of the contact layer 4, while oscillation in only one single transversal mode occurred up to comparatively high current strengths.

The laser described may be manufactured as follows.

Starting material is a substrate 5 of n-type gallium arsenide on which in a known manner the layers 6, 1, 3, 2 and 4 of the above-described composition and thickness are grown epitaxially. This may be done, for example, by growing from the liquid phase; for the details of this technique reference is made to the book "Crystal Growth From High Temperature Solutions" by D. Elwell and J. J. Scheel, Academic Press 1975, pp. 433–467. Herewith the structure shown in FIG. 2 is obtained.

Figure 3:
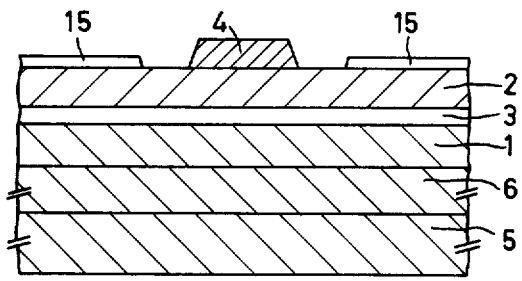

By using photolithographic etching methods, a strip-shaped mesa is then etched from the layer 4, a photolacquer layer being used as an etching mask and, for example, water and 30% $H_2O_2$ in a volume ratio 1:1, brought to a pH of 7.5 by means of $NH_4OH$, being used as an etchant. This etchant is selective and etches the layer 4 much more rapidly than the layer 2 so that the latter remains substantially unattacked. By means of, for example, vapor deposition, a layer 15 of silicon oxide or of aluminum oxide is then provided in a thickness of approximately 0.2 $\mu m$, after which a window is etched in said layer which exposes the contact layer 4 and a region with approximately 2 $\mu m$ on either side thereof. The FIG. 3 structure is thus obtained.

Figure 4:
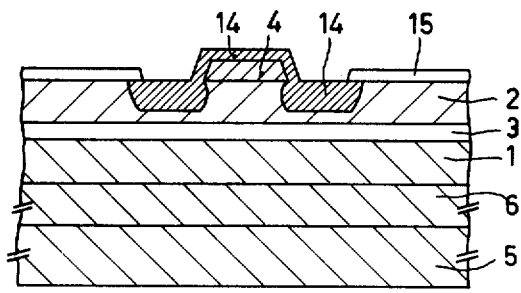

Zinc from a source of $ZnAs_2$ is then indiffused in the previously evacuated capsule at a temperature of 620° C. for 60 minutes. The depth of penetration in the layer 4 is approximately 0.7 $\mu m$ and in the layer 2 approximately double that, namely 1.4 $\mu m$. In this manner the p-type surface zone 14 is formed having a very steep diffusion profile and an average, rather homogeneous doping concentration of approximately $2.10^{19}$ atoms per $cm^3$, see FIG. 4.

Electrode layers 8 and 9 are then provided on the contact layer 4 and on the passive layer 2 (of which layers the contacted part is occupied by the highly doped zone 14), and on the substrate 5.

By scratching and breaking the cleavage faces 12 and 13 are then formed which serve as reflectors for the generated radiation and form the resonant cavity. The laser may then be mounted in the usual manner on a heat sink and be finished.

Many variations of the semiconductor laser described according to the invention are possible. Several are shown in FIGS. 5 to 8, in which for simplicity only a single substrate 5 (without epitaxial layer 6) has been drawn.

Figure 5:
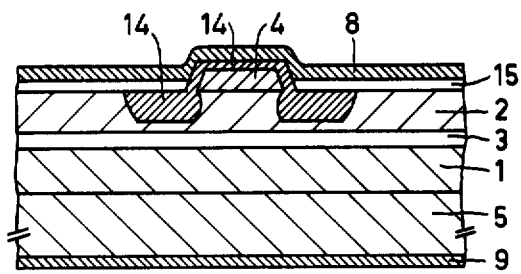
FIG. 5 is a diagrammatic cross-sectional view of a first modified embodiment of the semiconductor laser in accordance with the invention.

FIG. 5 is a diagrammatic cross-sectional view of a semiconductor laser according to the invention which is substantially equivalent to the laser shown in FIG. 1 with the difference that the insulating layer 15 continues up to the contact layer 4 so that the doped surface zone 14 beside the contact layer 4 is covered entirely by the insulating layer 15. This has for its advantage that the leakage current is smaller since the resistance via the contact layer over the zones diffused in the passive layer 2 is larger than in the semiconductor laser shown in FIG. 1 in which the zones 14 present within the layer 2 are contacted directly by means of the electrode layer 8.

Such a structure can be realized in a simple manner by first forming an oxide layer 15 with windows on either side of the contact layer 4 (as in FIG. 3), then forming the zone 14 and then forming an insulating layer over the whole surface. A (negative) photolacquer layer is then provided over the whole surface, which layer, in the liquid condition, draws away substantially entirely from the mesa 4 and remains only beside the mesa 4. By exposure and development a photolacquer mask is formed which is present only beside the mesa 4 on the insulating layer 15 and the insulating layer is brought in the form of FIG. 5 by etching.

Figure 6:
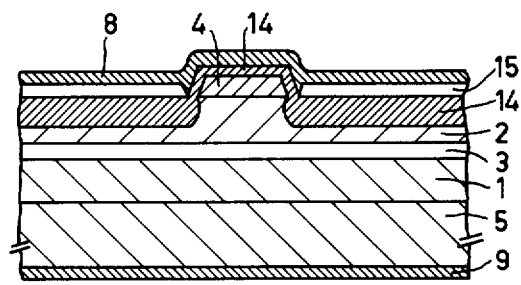
FIG. 6 is a diagrammatic cross-sectional view of a second modified embodiment of the semiconductor laser.

FIG. 6 is a diagrammatic cross-sectional view of an embodiment which is equal to that of FIG. 5 but in which the doped surface zone extends up to the edge of the crystal. Such a structure is easy to manufacture (for the diffusion of the zone 14 a mask is not necessary), but the leakage current on either side of the active region is larger.

Figure 7:
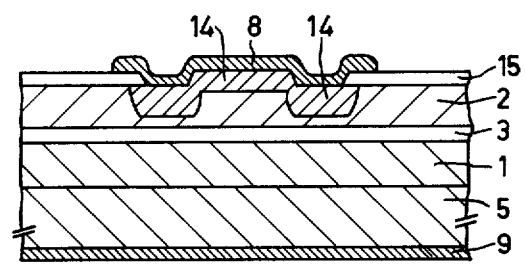
FIGS. 7 and 8 are diagrammatic cross-sectional views of two further modified embodiments of the semiconductor laser.

FIG. 7 shows an embodiment in which the zone 14 extends over the whole thickness of the contact layer into the passive layer 2 but in which the depth of penetration into the layer 2 below the mesa-shaped contact layer is smaller than beside it. In this manner also, when the difference in depth of penetration is well proportioned, the desired difference in effective refractive index can also be realized.

Figure 8:
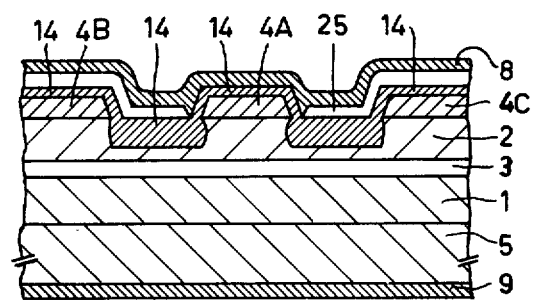

In the structures shown in FIGS. 1, 5 and 7, masking is used for the formation of the parts of the zone 14 situated beside the contact layer by the contact layer 4 and the insulating layer 15. Instead of an insulating layer 15, however, other parts of the contact layer 4 may also be used as a mask. FIG. 8, for example, is a diagrammatic cross-sectional view of a laser structure of the type shown in FIG. 1 in which in the manufacturing stage of FIG. 3 the oxide layer 15 is replaced by parts 4B and 4C of the contact layer, while the part 4A serves for the current supply. After the zinc diffusion, the parts 4B and 4C are covered with an electrically insulating layer 25 of, for example, silicon oxide.

The invention is not restricted to the embodiments described. For example, for the formation of the surface zone 14, instead of the diffusion step, any other doping method, for example, ion implantation, may also be used. Furthermore, all the conductivity types may be replaced by the opposite types and instead of gallium arsenide and gallium aluminum arsenide other semiconductor materials, for example InP and InGaAsP, may also be used. Instead of zinc, other dopants may be used; for example, in a p-type passive layer 2 cadmium or magnesium, and in an n-type passive layer 2 tellurium may be indiffused, and many other combinations are possible. For example, the zone 14 may also be indiffused from a doped oxide layer, instead of from the vapor phase.

A resonator formed by reflective cleavage faces was used in the examples. Instead, however, other resonators, for example, periodic deflection gratings, may also be used over at least a part of the length of the active strip-shaped region. Such resonators are used inter alia in so-called distributed feedback lasers as described, for example, in Applied Physics Letters, vol. 18, Feb. 15, 1971, pp. 152–154.

What is claimed is:

1. A semiconductor laser having a semiconductor body comprising a resonator and a first passive semiconductor layer of a first coductivity type, an active semiconductor layer on said first layer, a second passive semiconductor layer of the second opposite conductivity type on the active layer, a strip-shaped semiconductor contact layer of the second conductivity type on the second passive layer, and contact means for applying a voltage in the forward direction between the contact layer and the first passive layer to generate coherent electromagnetic radiation in a strip-shaped part of the active layer underlying the contact layer within said resonator, the passive layers having a smaller refractive index for the generated radiation than the active layer, a doped surface zone of the second conductivity type which extends over at least part of the thickness of the contact layer and extends in the second passive layer adjacent the contact layer, said surface zone having a higher doping concentration than that of the second passive layer, the doped surface zone extending adjacent the contact layer over only a part of the thickness of the second passive layer, the distance between the surface zone and the active layer being such that the effective refractive index for said generated electromagnetic radiation in the layer structure at the center of the contact layer is larger by an amount equal to at least 0.0005 and at most 0.005 than the effective refractive index in the layer structure adjacent the contact layer at the area of the doped surface zone.

2. A semiconductor laser as claimed in claim 1, characterized in that the thickness of the active layer is between a minimum thickness of 0.05 $\mu$m with an associated maximum value of 0.5 $\mu$m for the distance adjacent the contact layer between the doped surface zone and the active layer and an associated minimum value of $5 \times 10^{18}$ atoms per cm$^3$ for the average doping concentration of the surface zone, and a maximum thickness of 0.2 $\mu$m for the active layer, with an associated minimum value of 0.1 $\mu$m for said distance and an associated maximum doping concentration of $5 \times 10^{19}$ atoms per cm$^3$ for the surface zone.

3. A semiconductor laser as claimed in claim 1 or 2, characterized in that at least the second passive layer comprises gallium aluminum arsenide, while the contact layer comprises gallium aluminum arsenide having a lower aluminum content than the second passive layer or gallium arsenide.

4. A semiconductor laser as claimed in claim 1 or 2, characterized in that the second passive layer is p-type conductive and the surface zone is doped with zinc.

5. A semiconductor laser as claimed in claim 1 or 2, characterized in that the surface zone extends on both sides of the contact layer in the form of two parallel strip-shaped zones adjoining the contact layer.

6. A semiconductor laser as claimed in claim 1 or 2, characterized in that the doped surface zone adjacent the contact layer is covered substantially entirely with an electrically insulating layer.

7. A semiconductor laser as claimed in claim 1 or 2, characterized in that an electrode contacts the surface zone both above the contact layer and above the second passive layer.

8. A semiconductor laser as claimed in claim 1 or 2, characterized in that the doped surface zone extends only adjacent the contact layer in the second passive layer.

9. A semiconductor laser as claimed in claim 8, characterized in that the surface zone extends in the contact layer over a smaller depth than in the second passive layer.

* * * * *